United States Patent [19]
Kida et al.

[11] Patent Number: 5,877,942
[45] Date of Patent: Mar. 2, 1999

[54] CIRCUIT CARD ASSEMBLY FOOTPRINT PROVIDING REWORKABLE INTERCONNECTION PATHS FOR USE WITH A SURFACE MOUNT DEVICE

[75] Inventors: Luis S. Kida; Perry W. Crutchfield, both of San Diego; Kenneth W. Dickey, Escondido; Curtis D. Musfeldt, San Diego; Robert J. G. Vachon, El Cajon; Wayne G. Wilson, San Diego, all of Calif.

[73] Assignee: QUALCOMM Incorporated, San Diego, Calif.

[21] Appl. No.: 905,887

[22] Filed: Aug. 4, 1997

[51] Int. Cl.⁶ ...................................................... H05K 3/02
[52] U.S. Cl. .......................... 361/777; 361/683; 361/686; 361/728; 361/767; 364/491; 364/488; 364/489; 364/490; 395/500; 395/284; 395/182.01; 395/674
[58] Field of Search .................................. 361/777, 683, 361/686, 781, 783, 816, 728, 651, 767; 364/491, 488, 489, 490; 395/674, 500, 182.01, 284, 800.34

[56] References Cited

U.S. PATENT DOCUMENTS

| | | | |
|---|---|---|---|
| 5,537,295 | 7/1996 | Van Den Bout et al. | 361/767 |
| 5,583,749 | 12/1996 | Tredennick et al. | 361/790 |
| 5,621,650 | 4/1997 | Agrawal et al. | 364/489 |
| 5,648,913 | 7/1997 | Bennett et al. | 364/491 |

*Primary Examiner*—Leo P. Picard
*Assistant Examiner*—David Foster
*Attorney, Agent, or Firm*—Russell B. Miller; Brian S. Edmonston

[57] ABSTRACT

A circuit card assembly is provided for use in testing a system wherein the circuit card assembly employs a surface mount device such as a field programmable gate array. The circuit card assembly includes severable traces on a bottom surface of the assembly connecting pairs of near and far vias. The severable traces and the pairs of near and far vias allow the circuit card assembly to be selectively re-worked to accommodate changes to the design of the surface mount device. Hence, a new circuit card assembly need not be designed and fabricated each time the design or programming of the surface mount device is changed. The circuit card assembly includes a network of interconnection paths wherein each path to or from a pin terminal area of the circuit card assembly passes along at least one severable trace between at least one pair of near and far vias along the bottom surface of the assembly. Hence, any selected interconnection path to or from a terminal area can be broken, if desired, by severing the bottom surface trace of the selected path. Likewise, new interconnection paths can be added, if desired, between any two pre-existing paths to or from a terminal area by connecting jump wires along the bottom surface of the assembly between any two appropriate vias. Thus, re-working of interconnection paths of the circuit card assembly, perhaps to accommodate reprogramming of the surface mount device, is made much easier. Moreover, the chances that a re-programming of the surface mount device can be accommodated by re-working, rather than by fabricating a new circuit card assembly, is significantly enhanced.

13 Claims, 8 Drawing Sheets

CIRCUIT CARD ASSEMBLY FOOTPRINT PROVIDING REWORKABLE INTERCONNECTION PATHS FOR USE WITH A SURFACE MOUNT DEVICE

BACKGROUND OF THE INVENTION

I. Field of the Invention

The invention generally relates to printed wiring boards (PWB's) for use with surface mount integrated circuit (IC) devices such as Field Programmable Gate Array (FPGA) devices and in particular PWBFPGA's employed to emulate Application Specific Integrated Circuits (ASIC's) to the PWB.

II. Description of the Related Art

ASIC's are increasingly employed to perform data processing functions within electronic products, such as cellular telephones, computer devices, and the like. ASIC's are often preferred over non-application specific IC's, such as microprocessors, because ASIC's can be designed to perform sophisticated, specialized data processing at higher processing speeds than can be achieved using, for example, microprocessors. Attaining high processing speeds is often a critical consideration for many electronic products, especially products such as digital cellular telephones wherein a significant amount of data processing must be performed in real-time.

In the present highly competitive marketplace for electronic products, it is particularly important to be able to quickly develop new electronic products to maintain competitiveness. Unfortunately, a considerable amount of time is often requiring to design, fabricate and test the ASIC's to be employed in the electronic product. Moreover, the design of the ASIC is often dependent upon the design of system software which may be developed concurrently with the ASIC. Hence, changes to system software can require corresponding changes to the ASIC. Furthermore, even the basic specifications of the overall system or product may undergo revisions as the ASIC is being developed, thereby typically necessitating changes to the ASIC.

One technique for expediting the development of an ASIC is to employ one or more FPGA's to emulate the ASIC. The design cycle for an FPGA is typically much shorter than that of an ASIC and an FPGA can be easily and quickly reconfigured. Indeed, FPGA's are typically bought "off the shelf" and merely programmed via software to perform selected functions. Hence, the design of the ASIC can be developed, modified and tested relatively quickly using FPGA-emulation before the actual ASIC is fabricated. In particular, FPGA emulation allows for the relatively fast incorporation of modifications required in response to design changes necessitated by software or specification changes, or by correction of bugs and the like. Also the use of FPGA's to emulate an ASIC allows other components of the overall product or system or of a motherboard of the system to be tested as if the ASIC were present. In this regard, one or more FPGA's are connected to a motherboard to functionally replace the ASIC thereby allowing the motherboard or the entire product or system including the motherboard to be tested.

To emulate an ASIC using FPGA's, a PWB is fabricated to provide appropriate interconnection paths for interconnecting input/output pins of the FPGA's to each other or to external input/output devices and power sources. Some of the input/output pins of the FPGA are "fixed" pins dedicated to performing predefined functions such as providing power to the FPGA, programming the FPGA or resetting the operation of the FPGA. Other input/output pins of the FPGA are "user programmable pins" configurable by the user to route input to and output from the FPGA to, for example, facilitate emulation of the ASIC.

The input/output pins of the FPGA are coupled to a set of terminal areas (pads) on the PWB having a "footprint" configured to match the physical arrangement of the pins of the FPGA. FIG. 1 illustrates a conventional footprint 10 having a square arrangement of terminal areas 12 for use as part of a PWB configured to receive an FPGA having a square arrangement of input/output pins. Terminal areas for connection to fixed pins of the FPGA are connected to the appropriate external devices, such as power sources, via internal traces within the PWB. Terminal areas for connection to user programmable pins of the FPGA are typically connected by traces on the top surface of the PWB to plated through hole vias which, in turn, provide interconnection to other traces typically formed within inner layers of the PWB. The other traces typically interconnect with still other vias, which provide interconnection to other surface traces for connection back to the terminal areas of the FPGA or to the terminal areas of other devices on the PWB such as other FPGA's. Often, a fairly complicated network of interconnection paths is provided within the PWB. The PWB with the FPGA's and other devices mounted thereon is referred to as a circuit card assembly (CCA).

FIG. 2 illustrates a portion of a PWB having the footprint of FIG. 1 and also having an exemplary arrangement of vias and surface traces connected thereto. More specifically, FIG. 2 illustrates a set of surface traces 16 connecting a set of vias 18 to the terminal areas 12 of footprint 10. As can be seen, the vias are positioned adjacent to the terminal areas with each terminal area connected to a single respective via by a single surface trace. Although not shown in FIG. 2, additionally traces are provided on inner layers of the PWB which selectively interconnect the vias to one another or to the vias of other footprints for use with other FPGA's to thereby provide appropriate interconnection paths for the FPGA's.

The network of interconnection paths of the PWB for interconnecting the various terminals areas, vias, external pins, powers sources, etc. is typically designed using a computer routing tool which inputs a "netlist" defining how the pins of the FPGA interconnect to external pins or power sources. Typically the routing tool assumes that the footprint for use with the FPGA includes only the aforementioned terminal areas (FIG. 1) and operates to determine the location of all traces and all vias (FIG. 2). The routing tool converts the netlist into a set of specific interconnection paths formed from combinations of terminal areas, surface traces, vias and inner layer traces. The netlists often also include information specifying the required impedance for each path as well as other physical and electrical considerations such as any minimum spacing requirements between adjacent traces or vias. The routing tools are often designed to attempt to provide a set of interconnection paths that maximize performance while also minimizing mass production fabrication costs. Performance is maximized, typically, by providing the most compact possible network of interconnection paths providing the shortest possible signal paths with the lowest impedance. Typically this results in a PWB design having multiple internal layers of interconnection paths employing closely-spaced traces and vias. The traces are often arranged on inner layers of the PWB, rather than on the surface, to control and minimize impedance. Mass production costs are minimized, typically, by arranging the traces to provide a network of interconnection paths that requires the fewest and easiest steps to fabricate.

A PWB is then fabricated using the arrangement of interconnection paths defined by the routing tool and the FPGA's and other devices are mounted to the terminal areas footprints of the PWB to yield CCA. The FPGA's are programmed using the fixed programming pins of the FPGA to emulate the function of the ASIC. The CCA may then be mounted within a system having still other components. The functionality of the CCA or of the entire system is then tested (using any of a variety of conventional techniques), which in turn serves to test the design of the ASIC that the FPGA's are configured to emulate. If design flaws are detected, the FPGA's are redesigned to emulate a modified ASIC design and the process is repeated, i.e., the computer routing tool is employed to define a new set of interconnection paths, based on a new netlist of the redesigned FPGA, and a new PWB is fabricated for use with FPGA's programmed with the new design. This process continues until the design and functionality of the ASIC has been verified, then the ASIC itself is fabricated and tested.

As noted, because the cycle time to program and test an FPGA is much quicker than the cycle time required to design, fabricate and test an ASIC, the overall cycle time to develop an ASIC is expedited by employing FPGA's to emulate and test the ASIC design. Hence, the overall time required to develop a new electronic product employing the ASIC, such as a new cellular telephone or computer device is also expedited.

Although the use of FPGA's to emulate ASIC's has proven to be quite successful, room for improvement remains. One disadvantage relates to the PWB's that contain the interconnection paths employed for use with the FPGA's. Changes to an FPGA often necessitate changes to the interconnection paths. Hence, once any particular FPGA is redesigned, perhaps to remedy a design flaw in the ASIC that it is emulating, the PWB that was fabricated to provide interconnection paths for use with the previous FPGA design typically can no longer be used and is merely discarded. Hence, any CCA's that had been fabricated using the PWB are also discarded. Time and effort is required to fabricate a new PWB providing interconnection paths appropriate for use with the new FPGA design. A new CCA is then fabricated by mounting FPGA's and other devices to the new PWB and the FPGA's are programmed using the new FPGA design. Although the fabrication of a new CCA is much less expensive than that of an ASIC, such fabrication may still be expensive, particularly for CCA's having PWB's providing high density interconnection paths on multiple layers.

In some cases, redesign of the FPGA does not necessitate a new set of interconnection paths. This may occur, for example, if the redesign of the FPGA is purely internal and does not affect the pinout of the FPGA. In those cases, the FPGA mounted is merely reprogrammed by downloading the new configuration of the FPGA while is sits in-circuit within the CCA and then the CCA or the system it forms a part of is tested again. In rare cases, even if new interconnection paths are necessitated, changes to the interconnection paths can be accommodated merely by re-working selected interconnection paths of the CCA, perhaps by severing existing traces that are no longer required and by employing jump wires to provide new required paths between existing vias. If such is the case, the FPGA is merely reprogrammed and the interconnection paths of the CCA are re-worked to accommodate the new FPGA.

Unfortunately, the manner by which interconnection paths are conventionally routed on a PWB of the CCA usually prevents re-working of the interconnection paths merely by manually severing traces and providing jump wires. As noted above, computer routers are typically designed to determine the positions of all vias and traces for use with a fixed terminal footprint to generate compact interconnection path networks which maximize performance and minimize mass production costs. None of these considerations, however, is particularly advantageous when configuring PWB's to be used within CCA's only for testing ASIC-emulating FPGA's. Indeed, these considerations typically yield a network of interconnection paths that is difficult or impossible to re-work by severing traces and providing jump wires. In many cases, traces that need to be severed often lie within inner layers of the PWB and therefore cannot be severed. Even if the trace to be severed is on the surface, the trace may be too short or may be too closely spaced to other traces to be easily manually severed. Also in many cases, vias that need to be connected by jump wires may be buried, semi-buried or blind vias not accessible for reconnection using jump wires. Hence, largely because of the manner by which interconnection paths are conventionally routed and particularly because the router assumes a standard footprint that includes only terminal areas and determines the position of all vias and traces for use with that footprint, even a relatively simple modification to the interconnection path network cannot be accommodated without requiring fabrication of a new CCA incorporating a new PWB. Moreover, even if the network of interconnection paths can, in theory, be manually re-worked, it may be too difficult or time consuming to determine how the network is to be re-worked to make such a reconfiguration worthwhile. Also, if the pitch size of the PWB is too small, it may not be practical to manually reroute the PWB even if otherwise possible. Hence, if manual re-working is to be feasible, it is often necessary to employ a pitch size that is relatively large, which may be otherwise undesirable.

Accordingly it would be desirable to provide a technique for allowing CCA's to be more easily re-used in connection with redesigned FPGA's or other surface mount devices. In particular, it would be desirable to provide an enhanced footprint on the PWB of the CCA that maximizes the chances that a redesigned FPGA can be easily accommodated merely by re-working the interconnection paths of the PWB by, for example, manually severing traces and connecting jump wires. It is also desirable to provide an enhanced footprint that permits re-working even small pitch devices. Aspects to the invention are directed to these ends.

SUMMARY OF THE INVENTION

In accordance with one aspect of the invention, an improvement is provided to an apparatus for use with a surface mount device, such as an FPGA, wherein the apparatus is of the type having a set of interconnection paths formed of terminal areas, traces and vias. The improvement comprises providing pairs of near and far vias with the near and far vias of each pair interconnected on a surface of the apparatus by a severable trace and with all interconnection paths to or from terminal areas for use with user programmable input/output pins of the FPGA routed through at least one pair of near and far vias along at least one severable surface trace, such that selected interconnection paths of the apparatus are subject to re-working by severing selected ones of the severable traces on the surface of the apparatus and by adding jump wires over the surface of the apparatus between selected vias.

The improvement is achieved, for example, by defining a surface mount device footprint of the apparatus to include terminal areas as well as the pairs of near and far vias, the severable surface traces, and any additional traces for connecting the near vias to those terminal areas to be connected to user programmable pins of the FPGA. Thus the footprint does not only include terminal areas but also includes a predetermined fanout of surface traces and pairs of vias. Hence, when employed in connection with a routing tool, the router does not determine the location of all vias and traces. Rather, the router determines the locations of only those vias and traces that are in addition to the vias and traces of the footprint. By employing the improved footprint, it is ensured that all interconnection paths to or from terminal areas for use with user programmable input/output pins of the FPGA are routed through at least one pair of near and far vias along at least one severable surface trace. Traces for connection to the fixed pins of the surface mount device are not included in the footprint. Hence, the router does operate to determine the traces for connecting to the terminal areas for connection to the fixed pins.

With the configuration of vias and severable traces provided in accordance with this aspect of the invention, each connection path to or from a terminal area includes at least one portion formed of a trace extending between near and far vias along the surface of the apparatus. Hence, any selected interconnection path to or from a terminal area can be broken, if desired, by severing the corresponding trace provided along the surface. Likewise, new interconnection paths can be added, if desired, between any two pre-existing paths to or from a terminal area by connecting jump wires along the surface of the apparatus between any two appropriate vias. Thus, re-working of interconnection paths of the apparatus, perhaps to accommodate changes to the surface mount device, is made much easier. Moreover, the chances that a modification to the surface mount device can be accommodated by re-working is significantly enhanced. In this latter regard, the chances are significantly enhanced, in part, because each interconnection path to or from a terminal area has at least one severable trace on the surface of the apparatus bounded by at least two vias connected to the surface. Hence, for any particular interconnection path that needs to be broken to accommodate re-working of the apparatus, the chances that the interconnection has no severable traces on the surface and therefore cannot be manually broken are greatly reduced. Likewise, for any particular new interconnection path that needs be added by a jump wire to accommodate re-working of the apparatus, the chances that the new path cannot be added because the necessary preexisting paths have no vias extending to the surface of the apparatus for connecting to the jump wire are also greatly reduced. Also, fine pitch surface mount devices may be employed while still allowing for manual re-working of the apparatus. Other advantages may result as well.

In an exemplary embodiment, the apparatus is a PWB and the surface mount device is an FPGA employed to emulate an ASIC. The PWB with the FPGA (and perhaps other devices) mounted thereto forms a CCA. The surface of the PWB upon which the severable traces are formed is the bottom surface and is provided with a pattern of marked indicia for use in identifying the locations of the vias and the severable traces. The vias and surfaces traces are spaced widely enough apart to allow easy manual re-working.

In accordance with another aspect of the invention, a method for designing an apparatus for use with a surface mount device is provided. The apparatus includes sets of pairs of near and far vias with the near vias of each pair of vias selectively connected to terminal areas for use with user programmable pins of the surface mount device on a first surface of the apparatus and with the near and far vias of each pair of vias interconnected on a second surface of the apparatus by severable traces. The method includes the steps of determining the configuration of inputs and outputs of the surface mount device and designing the apparatus to provide interconnection paths appropriate for use with the surface mount device, with the interconnection paths including paths extending from terminal areas along traces formed on the first surface of the apparatus to selected near vias of the pairs of vias, then along the respective severable traces extending along a second surface of the apparatus to the respective far via. The method also includes the steps of mounting the surface mount device to the apparatus and programming the surface mount device. Then the configuration of the input and outputs of the surface mount device are re-determined, perhaps to correspond to changes in an ASIC that the surface mount device is emulating. The surface mount device is re-programmed and then the apparatus is re-worked to provide interconnection paths appropriate for use with the re-reprogrammed surface mount device by severing selected ones of the severable traces and attaching jump wires between selected vias.

In one exemplary embodiment of the method, the apparatus is a PWB, the surface mount device is an FPGA, and the combination of the PWB, the FPGA (and perhaps other devices) is a CCA. The first surface is the top surface and the second surface is the bottom surface. The step of designing the PWB includes the step of designing interconnection paths with each path that extends from a terminal area along a trace formed on the top surface of the PWB to a respective near via, then along the severable trace extending along the bottom surface of the PWB to the respective far via, being designed as a routing blockage. Also the step of designing the PWB includes the step of designing interconnection paths between the far vias only. Hence, interconnection paths are designed that do not include any paths extending from a near via to its respective far via other than the severable trace which directly connects the near via to its respective far via. The step of designing the PWB also includes the step of providing a pattern of marked indicia on the bottom surface of the PWB for use in identifying the locations of the vias. The step of re-working the PWB to provide interconnection paths appropriate for use with the re-programmed FPGA includes the step of generating values representative of the traces to be severed and the vias to be connected be jump wires and correlating those values with the marked indicia on the bottom surface of the PWB to facilitate an identification of the traces to be severed and the vias to be reconnected.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
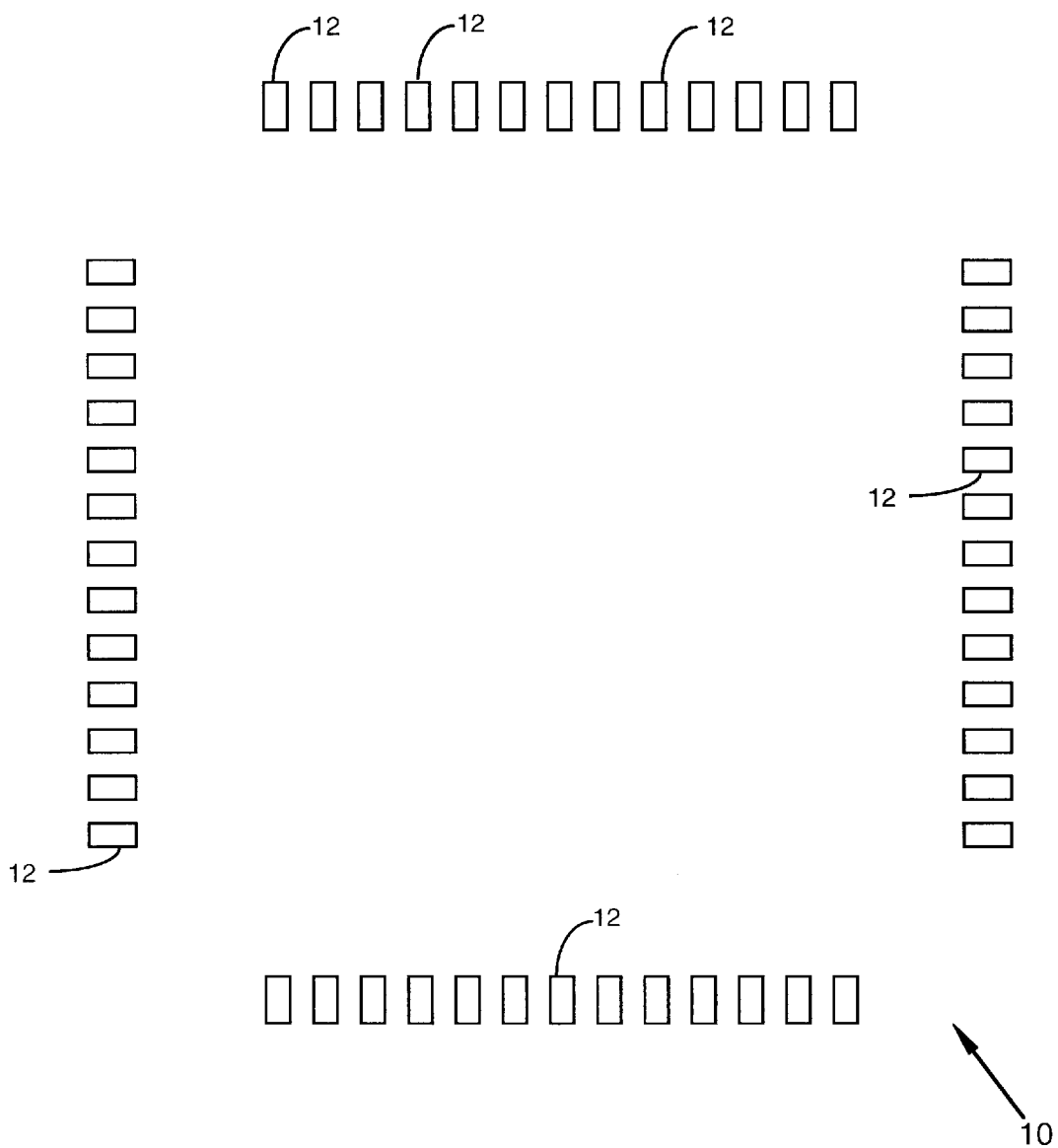
FIG. 1 is a top view of an exemplary, conventional footprint of terminal areas for use with a PWB for coupling a surface mount device (not shown) to the PWB.
Figure 2:
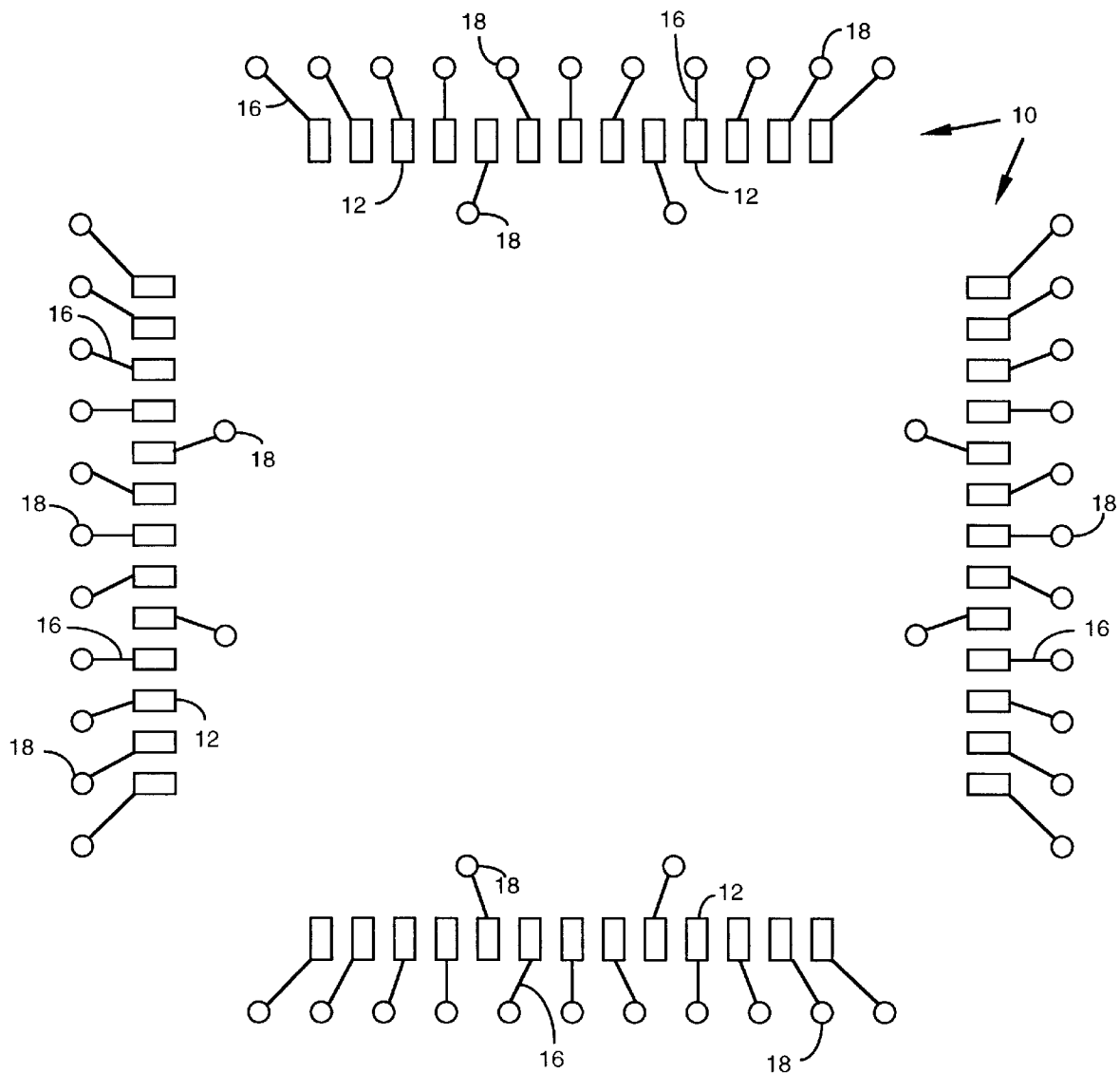
FIG. 2 is a top view of a portion of a PWB illustrating an exemplary, conventional fanout arrangement of surface traces and vias arranged using the footprint of FIG. 1.
Figure 3:
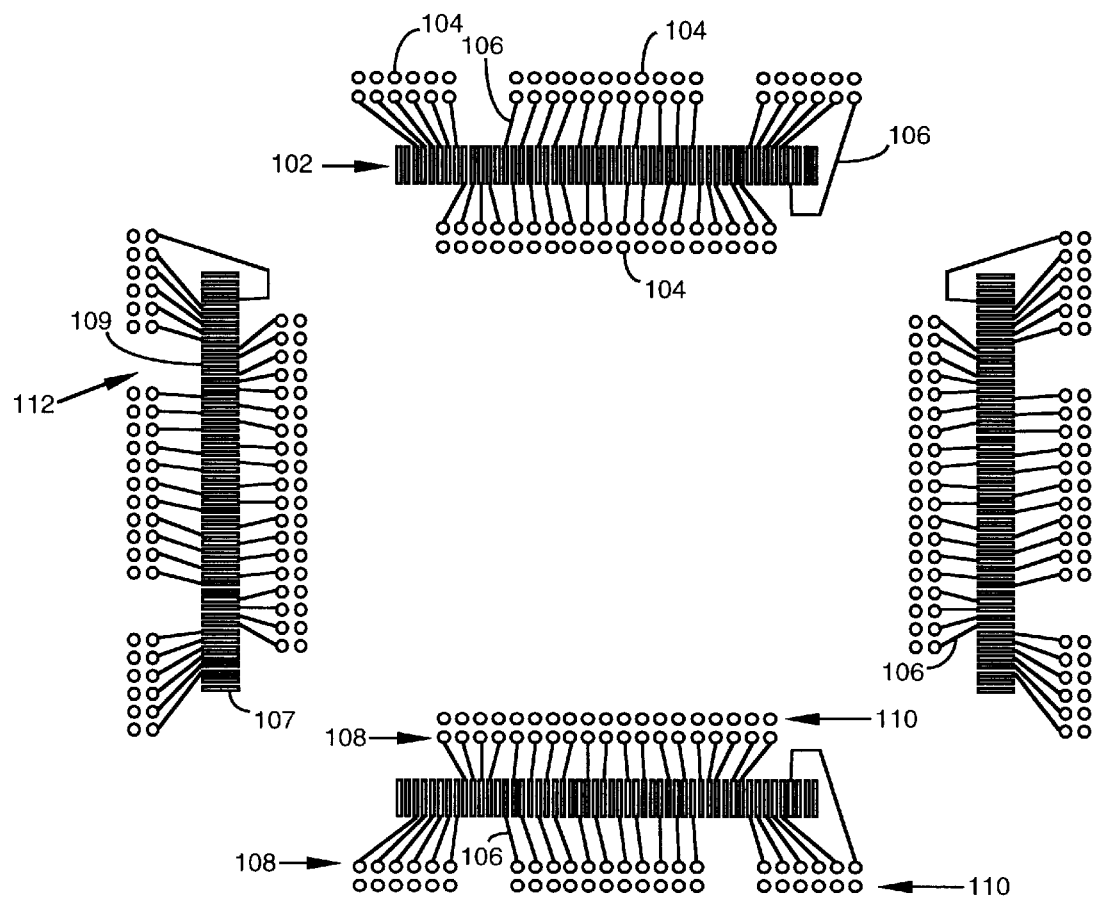
FIG. 3 is a top view of a footprint configured in accordance with an exemplary embodiment of the invention for use with a PWB wherein the footprint includes terminal areas, surface traces and pairs of near and far vias arranged, in part, to accommodate manual re-working of interconnection paths of the PWB.

With reference to the remaining figures, preferred and exemplary embodiments of the invention will now be described. FIG. 3 illustrates a set of terminal areas or pins 102, vias (generally denoted 104), and top surface traces 106 collectively defining a footprint 101 for use is designing a PWB for receiving an FPGA (shown in FIG. 7).

The layout of terminal areas 102 of footprint 101 is determined by the physical package of the FPGA that is intended to be mounted thereto. In the exemplary embodiment shown, the FPGA for mounting to the terminal areas is packaged in a fine pitched quad flat pack (QFP) (which is typical for high density FPGA's) having four groups of pins. Hence the terminal areas are arranged in a square pattern having four separate groups of terminal areas for matching the four groups of pins. An FPGA (shown below in FIG. 7) mounts to footprint 101 with pins of the FPGA directly coupled to respective terminal areas 102. As described above, some of the pins of the FPGA are user programmable, others are fixed. Footprint traces 106 connect the terminal areas that are to be coupled to user programmable pins of the FPGA to selected ones of the vias 104. Traces for connecting terminal areas for use with fixed pins, such as terminal area 107, are not part of footprint 101 and hence are not shown in FIG. 3. It should be understood, however, that a final PWB designed using footprint 101 also includes surface traces connecting the terminal areas for use with fixed pins to other vias (also not shown FIG. 3). Hence, in the final PWB, each terminal area is connected to at least one via by at least one surface trace.

Figure 4:
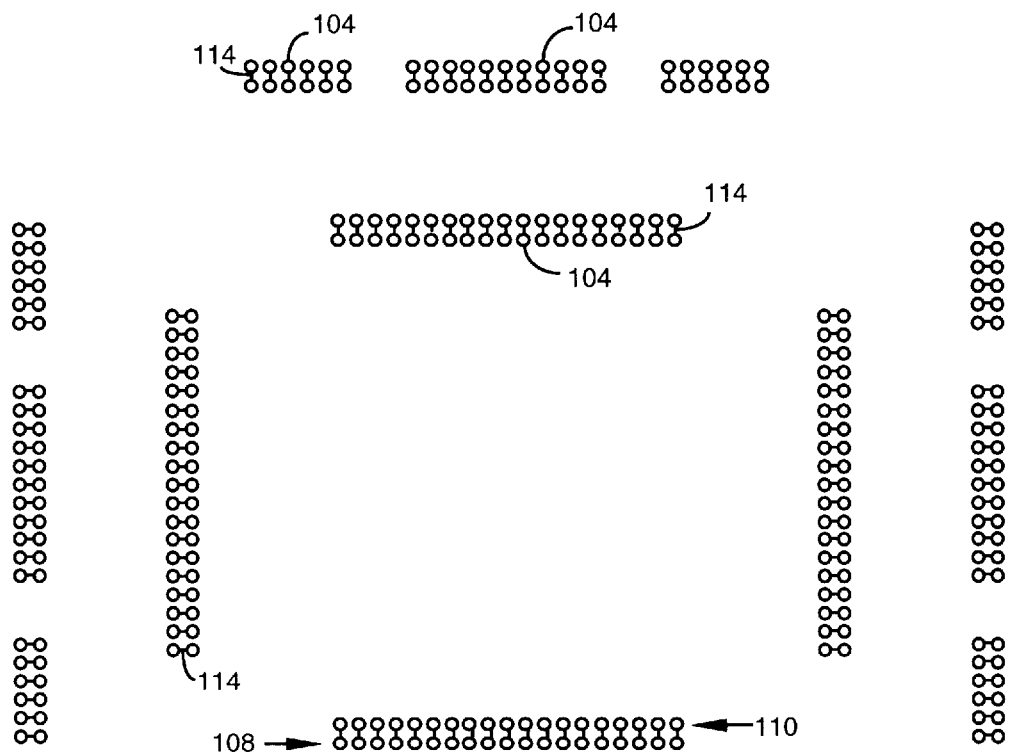
FIG. 4 is a bottom view of the footprint of FIG. 3 particularly illustrating a set of severable traces interconnecting respective pairs of near and far vias of the footprint.
Figure 7:
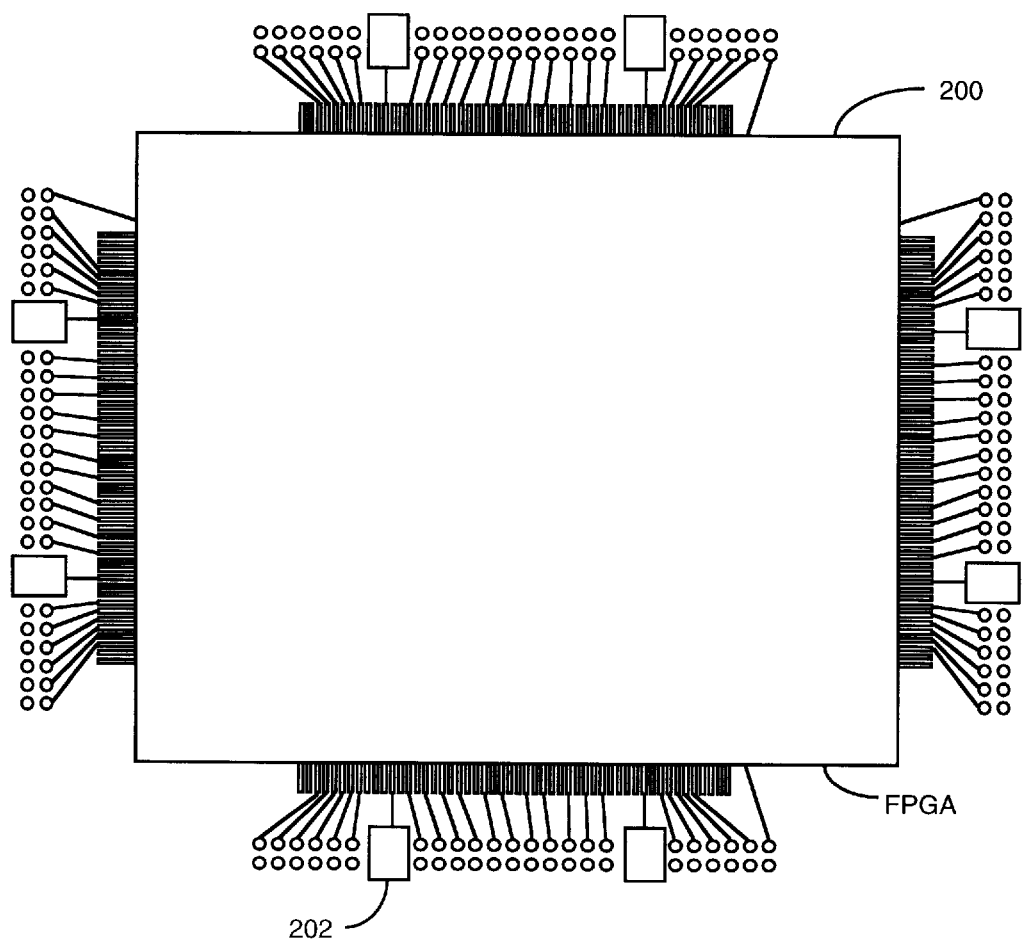
FIG. 7 is a top view of a portion of a CCA formed a PWB designed using the footprint of FIGS. 3 and 4, an FPGA mounted to terminal areas of the PWB, and a set of bypass capacitors mounted close to the FPGA.

Vias 104 are all plated-through hole vias extending from the top surface through to an opposing bottom surface of the PWB. In FIG. 3, only the top ends of the vias are shown. Vias 104 are arranged as sets of near vias 108 (so named because they are nearer to the terminal areas) and far vias 110 (so named because they are farther from the terminal areas). The vias are arranged in pairs with each pair having a near via and an adjacent far via. Some of the pairs of near and far vias are arranged inside of the terminal areas and are referred to herein as an inner set of vias. Other pairs are arranged outside of the terminal areas and are referred to herein as an outer set of vias. Pairs of vias in the outer set that are adjacent to terminal areas for connection to power sources (not shown), such as terminal area 109, include spaces or clearances 112 therebetween provided to allow optimum placement of a decoupling capacitor (FIG. 7). In particular, spaces 112 allow decoupling capacitors to be placed more closely to the FGPA where they provide the most benefit. FIG. 4 shows the bottom surface of footprint 101 particularly illustrating the bottom ends of vias 104. A single bottom surface trace 114 connects each near via to its respective far via.

When a PWB is designed and fabricated using footprint 101, a set of interconnection paths are thereby automatically provided wherein each interconnection path, connected to a terminal pad for connecting to a user-programmable pin of the FPGA, includes a least one path extending from a selected terminal area 102 (FIG. 3) along a respective top surface trace 106 to the top end of a respective near via 108, along the near via through the PWB to a bottom end of the near via on the bottom surface of the PWB (FIG. 4), then along the respective bottom surface trace 114 to the respective far via 110. The PWB interconnection path may additionally continue along the far via into inner layers (not shown) of the PWB then along internal traces (also not shown) formed on the internal layers of the PWB. The internal traces may be connected, for example, to one of the other vias of footprint 101 or to the vias of other footprints of the PWB.

Typically a large number of interconnection paths are formed using the various terminal areas, vias, surface traces and internal traces providing an entire network of paths. The routing of the network of interconnection paths (other than those forming the footprint) is performed by a computer routing tool which inputs the configuration of the footprint and also inputs a netlist defining how the pins of the FPGA interconnect to each other, to the pins of other devices or to external pins or power sources. The netlist may also include information specifying the required impedance for each path as well as other physical and electrical considerations such as any minimum spacing requirements between adjacent traces or vias. The routing tool may be entirely conventional but, because the routing tool is constrained to employ the footprint of FIGS. 3 and 4, each interconnection path generated by the routing tool for connection to or from a terminal area for use with a user programmable FPGA pin necessarily includes a portion extending between a pair of near and far vias of the footprint along the respective bottom surface trace.

Hence, all interconnection paths to or from a terminal area for connection to a user programmable pin of the FPGA include at least one portion extending along one of the bottom surface traces 114. The bottom surface traces are severable traces which can be severed manually or by machine by, for example, employing a razor blade or other sharp cutting implement. Thus, every interconnection path to or from one of the terminal areas for connection to a user programmable pin of the FPGA can be broken by selectively severing the bottom surface trace corresponding thereto. Moreover, all interconnection paths to or from a terminal area for connection to a user programmable pin include at least two vias extending through to the bottom surface of the PWB to allow selective re-working using jump wires. Hence, many if not all, of the interconnection paths of the network of interconnection paths can be selectively broken and re-worked to, for example, accommodate a design change in the FPGA necessitated by a corresponding design change in the ASIC which the FPGA is emulating. The jump wires may be attached by any appropriate conventional technique such as soldering.

Figure 5:
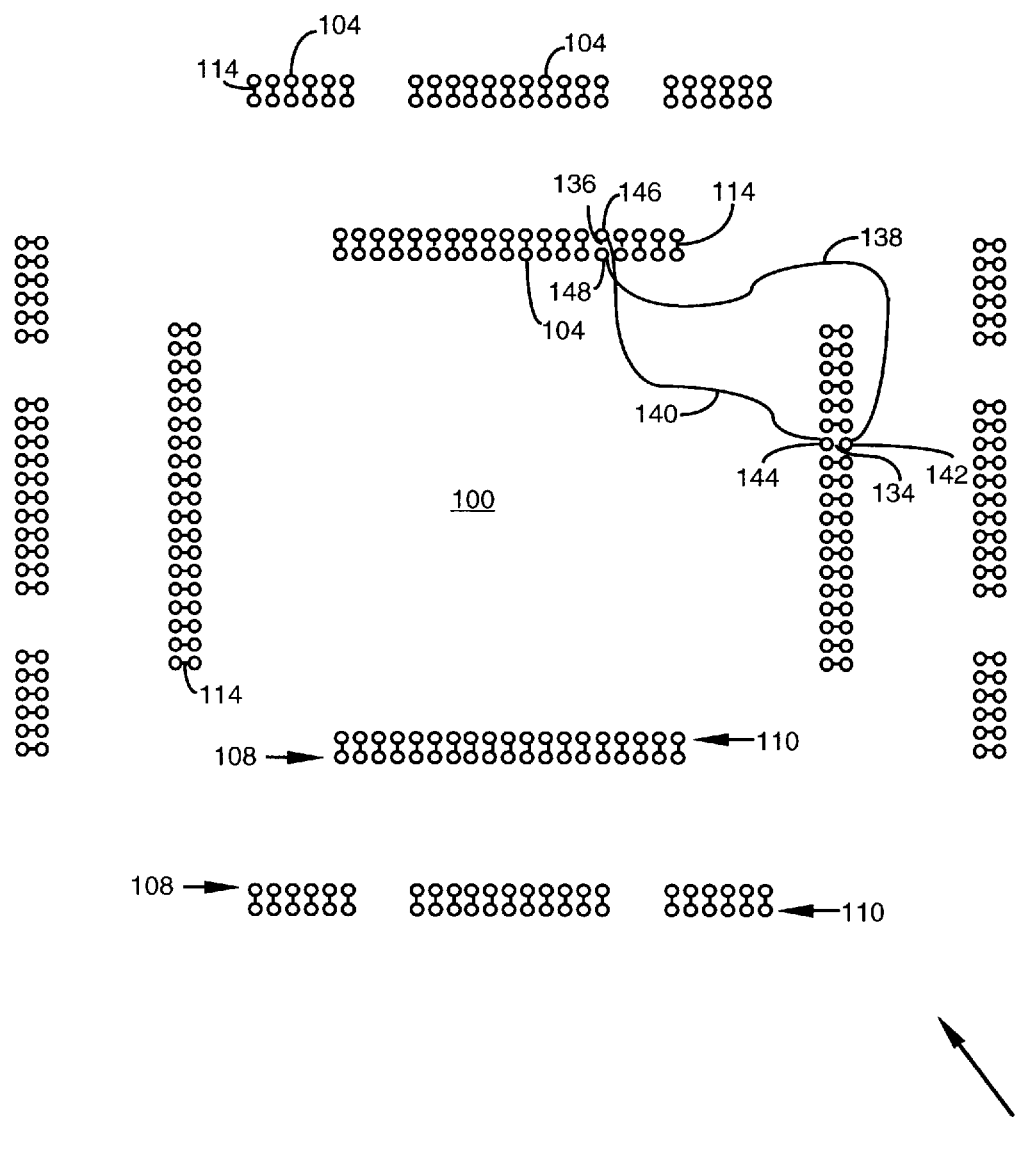
FIG. 5 is a bottom view of a CCA including a PWB designed using the footprint of FIGS. 3 and 4 and modified to re-work exemplary interconnection paths of the PWB by severing selected traces and providing jump wires.

FIG. 5 is a bottom view of a CCA 100 having a PWB designed using footprint 101 but wherein the PWB of the CCA has been subsequently modified to re-work a pair of interconnection paths by severing bottom surface traces 134 and 136 and connecting jump wires 138 and 140 between pairs of near and far vias 142, 144 and 146, 148, as shown. (Although shown in the figures as crossing, jump wires 138 and 140 are not coupled to one another at the cross-over point but, rather, merely pass over one another.) Hence, with the re-worked arrangement as show, signals from an FPGA pin coupled to a terminal area connected to near via 142 are routed to far via 148, rather than to far via 144, and subsequently routed along inner traces of the PWB of the CCA that are not separately shown. Likewise, signals from an FPGA pin coupled to a terminal area connected to near via 146 are routed to far via 144, rather than far via 148, and also subsequently routed along inner traces of the PWB of the CCA. The re-working operation of FIG. 5 is particularly useful to re-work the inputs and outputs of a pair of pins of the FPGA that have been reversed as a result of a design change. The exemplary re-working operation of FIG. 5 employing two-jump wires and two severed traces is merely illustrative of one type of re-working operation that can be accomplished. A wide variety of other re-working operations can be performed by either severing bottom surface traces or providing jump wires or both. Not all re-working operations require two jump wires. Likewise, not all re-working operations require severing two bottom surface traces. Also, not all jump wires need be connected between a near via and a far via. Actual re-working operations depend, of course, upon the interconnection paths that are already provided in the PWB and upon changes made to the design of an FPGA mounted thereto. Hence, no attempt is made herein to describe or illustrate all types of suitable re-working operations. In some cases, changes to the design of the FPGA cannot be accommodated by re-working the PWB. In those cases, a new PWB is designed and fabricated for use with the new FPGA design and a new CCA is fabricated using the new PWB and an FPGA programmed in accordance with the new FPGA design. However, in many cases, as a result of the routing of interconnection paths along severable bottom surface traces and the provision of near and far vias extending through to the bottom of the PWB of the CCA, the design change to the FPGA can be accommodated by merely re-working the PWB of the CCA.

The placement and spacing of the pairs of near and far vias is selected to facilitate manual re-working by providing adequate space between adjacent vias and by ensuring that the bottom surface traces are sufficiently long to allow for easy manual severing. Adjacent vias of different pairs of vias may, for example, be least one millimeter apart and the bottom surface traces connecting a pair of near and far vias may, for example, be at least two millimeters long. Of course, smaller relative dimensions can be accommodated, perhaps for use with automated equipment configured for severing traces and connecting jump wires.

The re-working operations to be performed may be determined by a designer provided with schematics of the original set of interconnection paths provided for use with the original FPGA and of a modified set of interconnection paths for use with the modified FPGA. The designer manually identifies which traces are to be severed and which vias are to be connected using jump wires by examining the schematics. Preferably, however, the re-working operations to be performed are determined by a software tool which compares computer aided design (CAD) representations of the original set of interconnection paths provided for use with the original FPGA to a modified set of interconnection paths for use with the modified FPGA and automatically identifies which traces are to be severed and which vias are to be connected using jump wires. If no amount of re-working will accommodate a redesigned FPGA, the tool preferably identifies that such is the case and a new PWB is then fabricated with new interconnection paths appropriate for the new FPGA design. An FPGA is mounted to the PWB yielding a new CCA and the FPGA is then programmed to employ the new FPGA design. Assuming, however, that the PWB of the original CCA can be re-worked, a designer then visually identifies the traces and vias to be re-worked and manually performs the re-working operations as specified by the comparison tool such that a new PWB and therefore a new CCA need not be fabricated.

Figure 6:
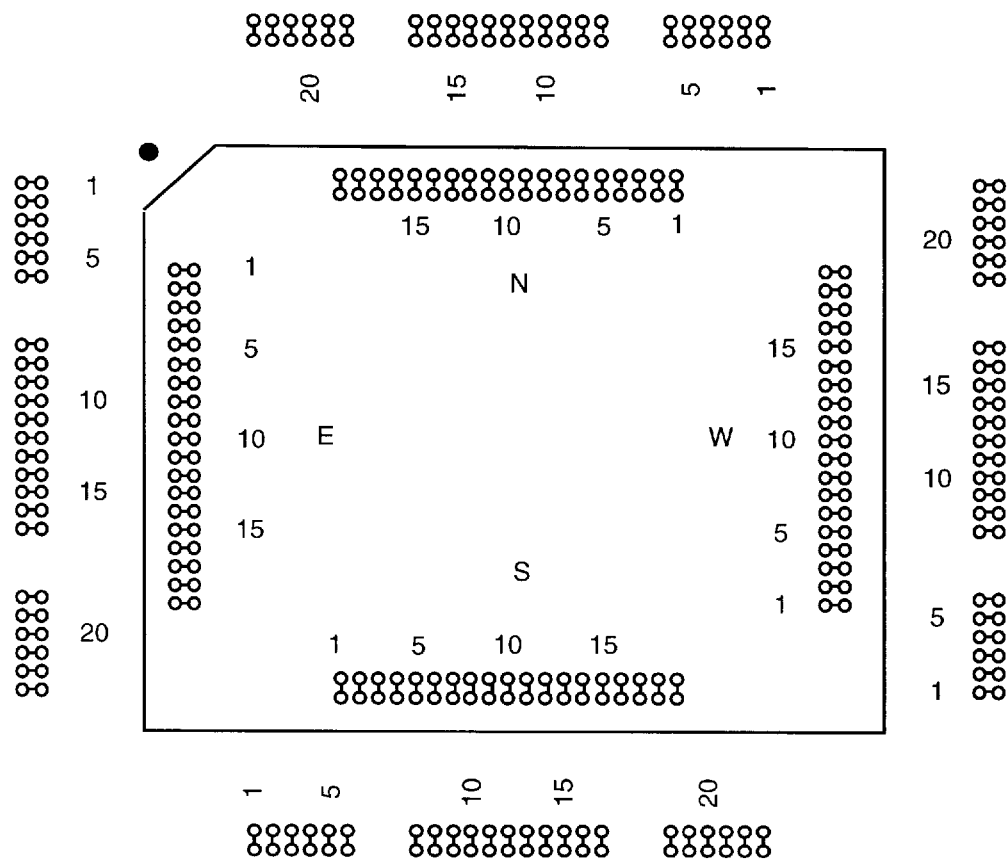
FIG. 6 is a bottom view of a PWB designed using the footprint of FIGS. 3 and 4 wherein the PWB is also provided with marked indicia to facilitate visual identification of traces that need to be severed and vias that need to be re-worked.

To facilitate visual identification of the traces and the vias, the PWB is preferably provided with a set of marked indicia as shown in FIG. 6 and the comparison tool is programmed to identify the traces and vias with reference to the marked indicia. (In FIG. 6, the marked indicia includes the digits 1, 5, 10, 15 and 20, the letters E, N, S and W, and the notched rectangular box encircling the inner sets of vias and the dot adjacent tot he notch.) For example, the comparison tool may identify a trace to be severed as being inner trace N11 on a particular device of the CCA, such as a device U1. Accordingly, an operator performing the re-working operation visually identifies the traces to be severed by finding the nearest trace of the inner set of traces to position N11 on device U1 of the CCA. As another example, the comparison tool may identify a pair of vias to be connected by a jump wire as being outer far via S1 and outer near via S20 on a device U2. Accordingly, an operator performing the re-working operation visually identifies the vias to be connected by a jump wire by finding the nearest outer far via to position S1 on device U2 of the CCA and the nearest outer near via to position S20 on device U2 of the CCA. If automated re-working equipment is employed, the comparison tool preferably identifies the locations of the traces and vias in terms of coordinates that can be input to the automated re-working machinery.

As noted above, an FPGA is mounted to the PWB to yield a CCA for use, for example, in emulating an ASIC ultimately intended for use with the CCA or for use with another CCA or another apparatus. Pins of the FPGA are coupled directly to the terminal areas of the PWB. FIG. 7 illustrates a portion of a top surface of a CCA with an FPGA 200 mounted thereto and with decoupling capacitors 202 mounted in the aforementioned clearance areas.

Figure 8:
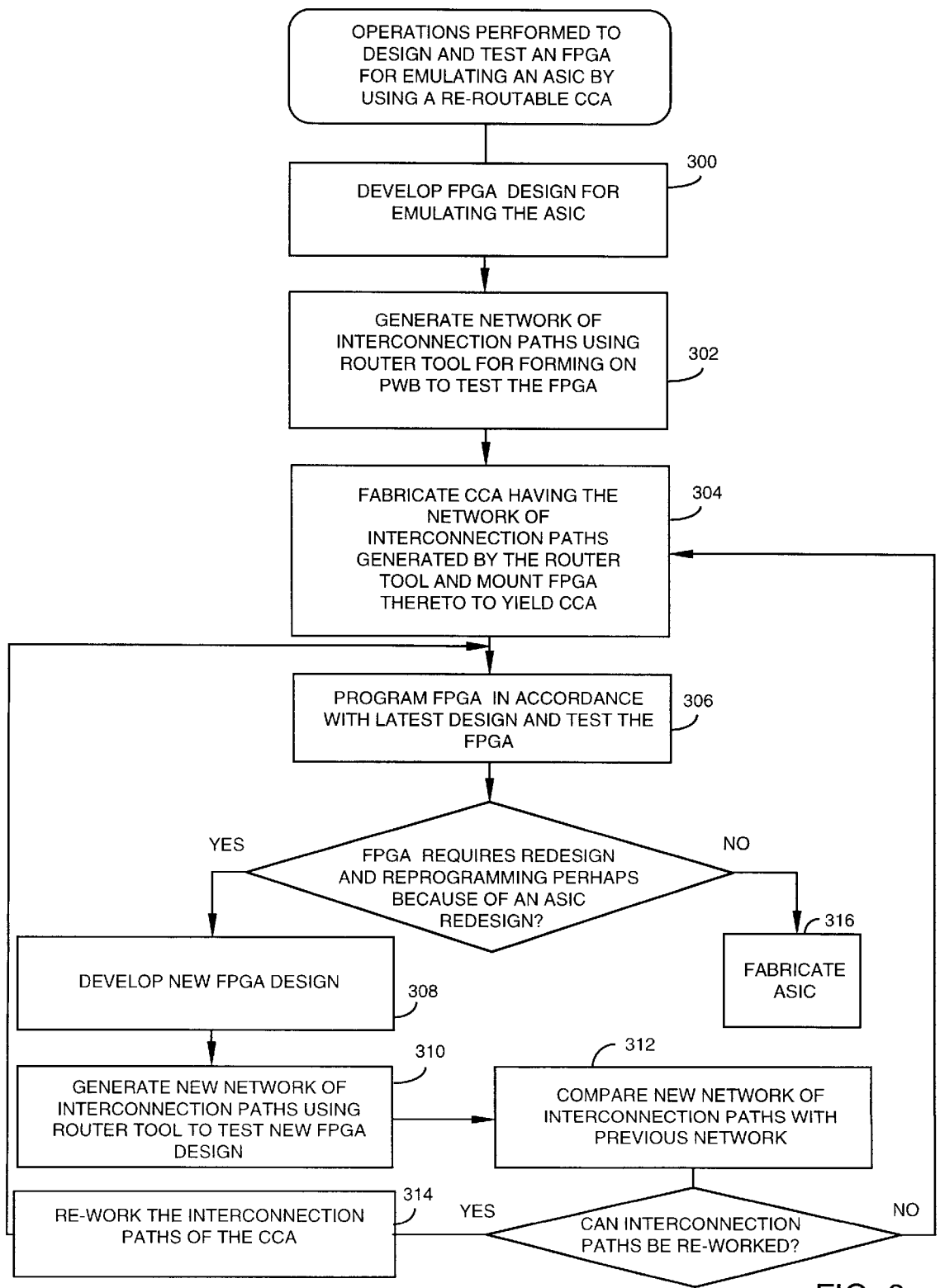
FIG. 8 is a flowchart summarizing steps for developing an ASIC using FPGA-emulation employing a PWB designed using the footprint shown in FIGS. 3 and 4.

When fabricating a CCA having a PWB designed using a footprint such as shown in FIGS. 3 and 4, the aforementioned re-working operations in response to changes to an FPGA or other surface mount device proceeds as summarized in FIG. 8. Initially, at step 300, an FPGA design is developed to emulate an ASIC or other device. At step 302, a network of interconnection paths appropriate for use with the FPGA is generated by a router tool subject to the constraints described above and employing the footprint described above. At step 304, a PWB is fabricated having the network of interconnection paths as defined by the router tool and an FPGA and perhaps other components are mounted thereto yielding a CCA.

At step 306, the FPGA is programmed in accordance with the deign established at step 300 and the CCA (or a system incorporating the CCA) is tested. If the FPGA needs to be reprogrammed perhaps to accommodate changes in a redesigned ASIC or for any other reason, then, at step 308, a new FPGA designed is developed. At step 310 the router tool generates a new network of interconnection paths appropriate for use with the new FPGA design. At step 312, the new network of interconnection paths are compared with the previous network of interconnection paths by a comparison tool. The tool determines whether the previous network of interconnection paths can be re-worked by severing traces and connecting vias with jumps wires. If not, step 304 is again performed to fabricate a new CCA and, at step 306, a new FPGA is mounted thereto, programmed in accordance with the new FPGA design and the CCA is tested. If the interconnection paths can be re-worked, then step 314 is instead performed wherein the CCA is re-worked (by, for example, manually severing surface traces and adding jump wires) to provide the new network of interconnection paths then step 306 is performed again. As before, if the FPGA needs to be reprogrammed because the ASIC that it is emulating has been redesigned or for any other reason, then step 308 is again performed. The steps of the flowchart of FIG. 8 are repeated in this manner until a determination is made that the FPGA requires no further reprogramming. Then, if the purpose of the FPGA was to emulate an ASIC, the ASIC itself is fabricated, step 316.

As described above, the cycle time for designing, programming and testing an FPGA is typically much faster than the cycle time for designing, fabricating and testing an ASIC that it is often expedient to develop the ASIC design using ASIC-emulating FPGA's. The cycle time for the FPGA is further reduced by using the re-working techniques described above, thereby allowing the ASIC to be developed even faster to, for example, allow products intended to incorporate the ASIC to be brought to market faster. Of course, techniques described herein provide other advantages as well. For example, even for FPGA's that are not intended merely to emulate an ASIC, the techniques described herein are helpful in reducing the cycle time for developing the FPGA itself. Also, techniques of the invention may be applied to other surface mount devices and to non-surface mount devices as well.

The exemplary embodiments have been primarily described with reference to diagrams illustrating apparatus elements and to a flow chart primarily illustrating method steps. As to the flowchart, each block therein represents both a method step and an apparatus element for performing the recited step. Depending upon the implementation, each apparatus element for performing the method step, or portions thereof, may be configured in hardware, software, firmware or combinations thereof. It should be appreciated that not all components necessary for a complete implementation of a practical system are illustrated or described in detail. Rather, only those components necessary for a thorough understanding of the invention have been illustrated and described.

Finally, the preceding description of the preferred and exemplary embodiments is provided to enable any person skilled in the art to make or use the present invention. Various modifications to these embodiments will be readily apparent to those skilled in the art and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. In an apparatus for use with a surface mount device having at least some user programmable pins and wherein the apparatus has a set of interconnection paths formed of terminal areas, traces and vias, an improvement comprising:

providing pairs of near and far vias with the near and far vias of each pair interconnected on a surface of the apparatus by a severable trace and with all interconnection paths to or from terminal areas for use with the user programmable input/output pins of the surface mount device routed through at least one pair of near and far vias along at least one severable surface trace, such that selected interconnection paths of the apparatus are subject to re-working by severing selected ones of the severable traces on the surface of the apparatus and by adding jump wires over the surface of the apparatus between selected vias.

2. An apparatus, having a set of interconnection paths, for use with a surface mount device, said apparatus comprising:

a set of terminal areas formed on a first side surface of the apparatus for connection to the surface mount device;

a set of pairs of first and second vias interconnecting the first side surface of the apparatus to a second side surface thereof;

a first set of traces extending along a first side surface of the apparatus from selected terminal areas to selected first vias of the pairs of vias; and a second set of traces extending along the second side surface of the apparatus and interconnecting the first via of each pair of vias to its respective second via, said second set of traces being selectively severable.

3. The apparatus of claim 2, wherein the surface mount device includes at least some user programmable pins and wherein said selected terminal areas are terminal areas for use with the user programmable pins of the surface mount device.

4. The apparatus of claim 2 wherein the apparatus is a printed wiring board.

5. The apparatus of claim 2, wherein the surface mount device is a field programmable gate array.

6. The apparatus of claim 2 with at least one surface mount device mounted thereto forming a circuit card assembly.

7. The apparatus of claim 2, wherein selected ones of the second vias are offset from adjacent vias by an amount sufficient to allow placement of a decoupling capacitor.

8. The apparatus of claim 2, wherein the first vias are near vias and the second vias are far vias.

9. The apparatus of claim 2, wherein at least one of said second traces on the second side surface of the apparatus is severed and an alternative connection line interconnects the respective first via of the severed trace to another via also on the second side surface of the apparatus.

10. The apparatus of claim 2, wherein the first side surface is the top surface and the second side surface in the bottom surface.

11. The apparatus of claim 2, wherein the interconnection paths do not include any paths extending from a first via to its respective second via other than the severable trace which directly connects the first via to its respective second via.

12. The apparatus of claim 2, wherein the second side surface of the apparatus includes a pattern of marked indicia for use in identifying the locations of the vias.

13. In an apparatus for use with a surface mount device having at least some user programmable pins and wherein the apparatus has a footprint for coupling the surface mount device to interconnection paths of the apparatus, an improvement comprising:

providing a footprint that includes a set of terminal areas, pairs of near and far vias, and surface traces, with the near and far vias of each pair interconnected on a surface of the apparatus by a severable trace and with all interconnection paths to or from terminal areas of the footprint for use with the user programmable input/output pins of the surface mount device being routed through at least one pair of near and far vias along at least one severable surface trace, such that selected interconnection paths of the apparatus are subject to re-working by severing selected ones of the severable traces on the surface of the apparatus and by adding jump wires over the surface of the apparatus between selected vias.

* * * * *